(12) United States Patent  
Eom et al.

(10) Patent No.: US 9,041,278 B2  
(45) Date of Patent: May 26, 2015

(54) DISPLAY PANEL, ORGANIC LIGHT EMITTING DISPLAY DEVICE HAVING THE SAME, AND METHOD OF MANUFACTURING A DISPLAY PANEL

(71) Applicants: Ji-Hye Eom, Yongin (KR); Hae-Yeon Lee, Yongin (KR)

(72) Inventors: Ji-Hye Eom, Yongin (KR); Hae-Yeon Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 68 days.

(21) Appl. No.: 13/901,616

(22) Filed: May 24, 2013

(65) Prior Publication Data

US 2014/0097743 A1 Apr. 10, 2014

(30) Foreign Application Priority Data

Oct. 5, 2012 (KR) ........................ 10-2012-0110609

(51) Int. Cl.
| | |
|---|---|
| *H01J 63/04* | (2006.01) |
| *H01L 51/52* | (2006.01) |
| *H01L 51/56* | (2006.01) |
| *H01L 27/32* | (2006.01) |

(52) U.S. Cl.
CPC ............... *H01L 51/52* (2013.01); *H01L 51/56* (2013.01); *H01L 51/5262* (2013.01); *H01L 27/3258* (2013.01); *H01L 27/326* (2013.01)

(58) Field of Classification Search
USPC ....................................... 445/24; 313/498, 504
See application file for complete search history.

(56) References Cited

U.S. PATENT DOCUMENTS

| | | |
|---|---|---|
| 2009/0278866 A1 | 11/2009 | Kim |
| 2010/0177024 A1 | 7/2010 | Choi |
| 2011/0291091 A1 | 12/2011 | Kim et al. |

FOREIGN PATENT DOCUMENTS

| | | |
|---|---|---|
| KR | 10-2009-0116874 A | 11/2009 |
| KR | 10-2010-0082933 A | 7/2010 |
| KR | 10-2011-0131958 A | 12/2011 |

*Primary Examiner* — Mary Ellen Bowman  
(74) *Attorney, Agent, or Firm* — Lee & Morse, P.C.

(57) ABSTRACT

A method of manufacturing a display panel of an organic light emitting display device includes determining a plurality of pixel groups, the pixel groups corresponding to groups of pixels of the display panel, calculating aperture ratios for the pixels, respective aperture ratios being calculated by pixel group based on respective distances between a power unit and the pixel groups, and forming the pixels of the display panel to have the respective aperture ratios according to the corresponding pixel groups.

21 Claims, 11 Drawing Sheets

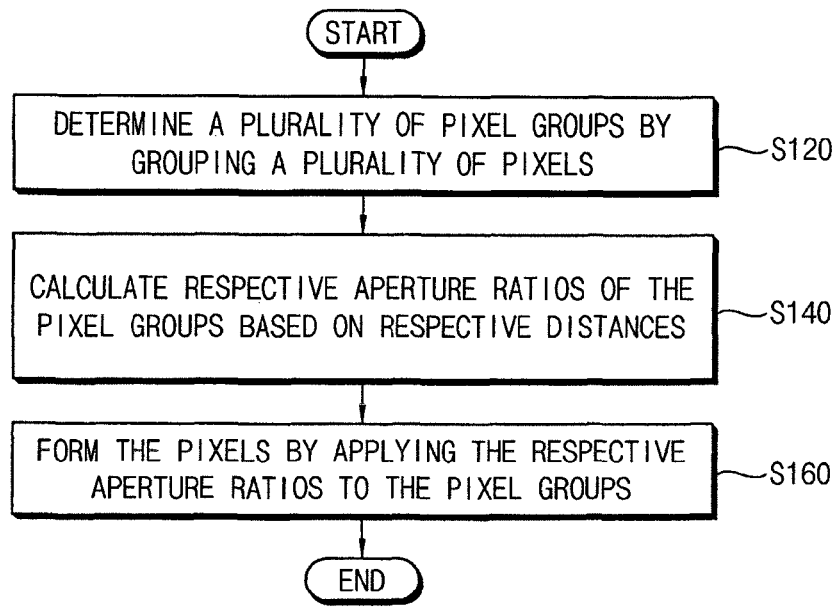
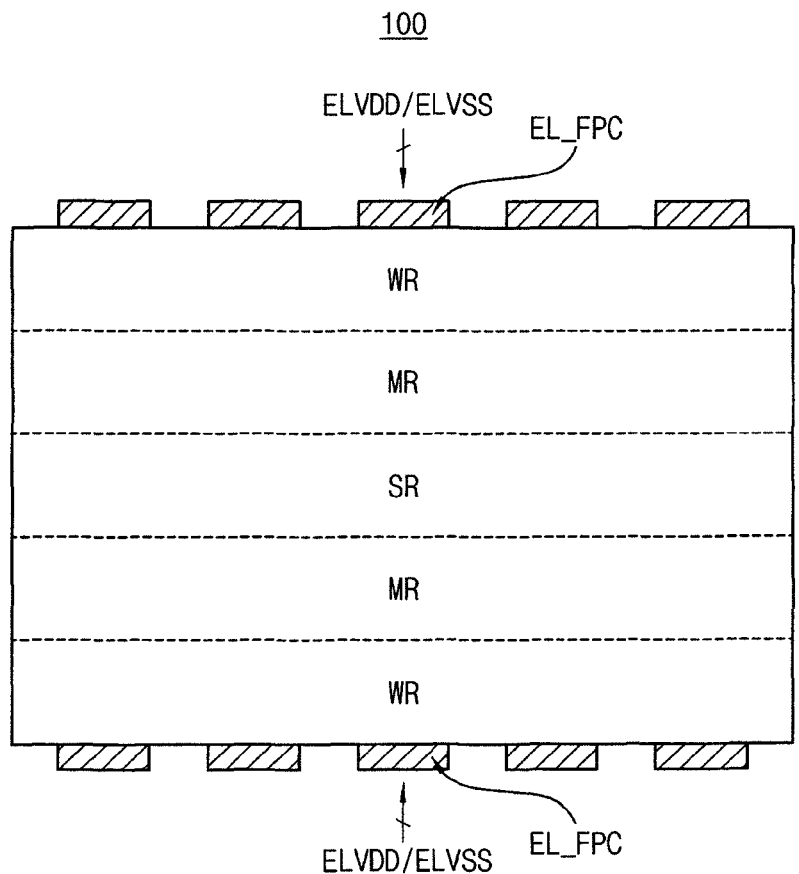

DISPLAY PANEL, ORGANIC LIGHT EMITTING DISPLAY DEVICE HAVING THE SAME, AND METHOD OF MANUFACTURING A DISPLAY PANEL

CROSS-REFERENCE TO RELATED APPLICATION

This application claims priority to and the benefit of Korean Patent Application No. 10-2012-0110609 filed in the Korean Intellectual Property Office on Oct. 5, 2012, the entire contents of which are incorporated herein by reference.

BACKGROUND

1. Field

Embodiments relate to a display panel, an organic light emitting display device having the display panel, and a method of manufacturing the display panel.

2. Description of the Related Art

Generally, since an organic light emitting display (OLED) device displays an image using an organic light emitting diode that emits light by itself, the organic light emitting display device is not required to include a light source. Thus, the organic light emitting display device may be manufactured thinner and lighter than a liquid crystal display (LCD) device that includes a light source. In addition, the organic light emitting display device may have various advantages related to power consumption, luminance, speed of response, etc., compared to the liquid crystal display device. For this reason, the organic light emitting display device is widely used as a flat panel display device.

SUMMARY

Embodiments are directed to a method of manufacturing a display panel of an organic light emitting display device, the display panel having a plurality of pixels, the method including determining a plurality of pixel groups, the pixel groups corresponding to groups of pixels of the display panel, calculating aperture ratios for the pixels, respective aperture ratios being calculated by pixel group based on respective distances between a power unit and the pixel groups, and forming the pixels of the display panel to have the respective aperture ratios according to the corresponding pixel groups.

Pixels coupled to a single scan line of the display panel may constitute one pixel group.

Pixels coupled to K scan lines of the display panel may constitute one pixel group, K being an integer greater than or equal to 2 and less than or equal to a total number of all scan lines of the display panel.

The aperture ratios of the respective pixel groups may increase as the respective distances between the power unit and the pixel groups increase, and the aperture ratios of the respective pixel groups may decrease as the respective distances between the power unit and the pixel groups decrease.

A quantity of patterns formed on over-coating layers of the pixels may increase as the respective distances between the power unit and the pixel groups increase, and the quantity of the patterns formed on the over-coating layers of the pixels may decrease as the respective distances between the power unit and the pixel groups decrease.

The patterns may correspond to stripe patterns.
The patterns may correspond to grid patterns.
The patterns may correspond to polygon patterns.

Embodiments are also directed to a display panel, including a plurality of scan lines, a plurality of data lines, a plurality of power lines, and a plurality of pixels, the pixels being disposed at locations corresponding to crossing points of the scan lines and the data lines, the pixels being grouped into pixel groups and having aperture ratios corresponding to the pixel groups, the pixel groups having different respective aperture ratios based on respective distances between a power unit and the pixel groups, the power unit being coupled to the power lines.

Pixels coupled to a single scan line of the display panel may constitute one pixel group.

Pixels coupled to K scan lines of the display panel may constitute one pixel group, K being an integer greater than or equal to 2 and less than or equal to a total number of all scan lines of the display panel.

The aperture ratios of the respective pixel groups may increase as the respective distances between the power unit and the pixel groups increase, and the aperture ratios of the respective pixel groups may decrease as the respective distances between the power unit and the pixel groups decrease.

A quantity of patterns formed on over-coating layers of the pixels may increase as the respective distances between the power unit and the pixel groups increase, and the quantity of the patterns formed on the over-coating layers of the pixels may decrease as the respective distances between the power unit and the pixel groups decrease.

Embodiments are also directed to an organic light emitting display device, including a display panel having a plurality of pixels, the pixels being grouped into pixel groups and having aperture ratios corresponding to the pixel groups, a scan driving unit configured to provide a scan signal to the pixels, a data driving unit configured to provide a data signal to the pixels, a power unit configured to provide a high power voltage and a low power voltage to the pixels, the respective pixel groups having different aperture ratios based on respective distances between the power unit and the pixel groups, and a timing control unit configured to control the scan driving unit, the data driving unit, and the power unit.

Pixels coupled a single scan line may constitute one pixel group.

Pixels coupled to K scan lines may constitute one pixel group, K being an integer greater than or equal to 2 and less than or equal to a total number of all scan lines.

The aperture ratios of the respective pixel groups may increase as the respective distances between the power unit and the pixel groups increase, and the aperture ratios of the respective pixel groups may decrease as the respective distances between the power unit and the pixel groups decrease.

The high power voltage may be transferred from an upper display region and a lower display region of the display panel to a middle display region of the display panel, and the aperture ratios of the respective pixel groups may be higher in the middle display region than in the upper display region and the lower display region.

The aperture ratios of the respective pixel groups may be higher in a lower display region of the display panel than in an upper display region of the display panel when the high power voltage is transferred from the upper display region to the lower display region, and the aperture ratios of the respective pixel groups may be higher in the upper display region than in the lower display region when the high power voltage is transferred from the lower display region to the upper display region.

A quantity of patterns formed on over-coating layers of the pixels may increase as the respective distances between the power unit and the pixel groups increase, and the quantity of the patterns formed on the over-coating layers of the pixels may decrease as the respective distances between the power unit and the pixel groups decrease.

BRIEF DESCRIPTION OF THE DRAWINGS

Features will become apparent to those of skill in the art by describing in detail exemplary embodiments with reference to the attached drawings in which:

FIG. 1 is a flow chart illustrating a method of manufacturing a display panel according to example embodiments.

FIG. 2A is a diagram illustrating an example of a display panel manufactured by a method of FIG. 1.

DETAILED DESCRIPTION

Figure 2B:
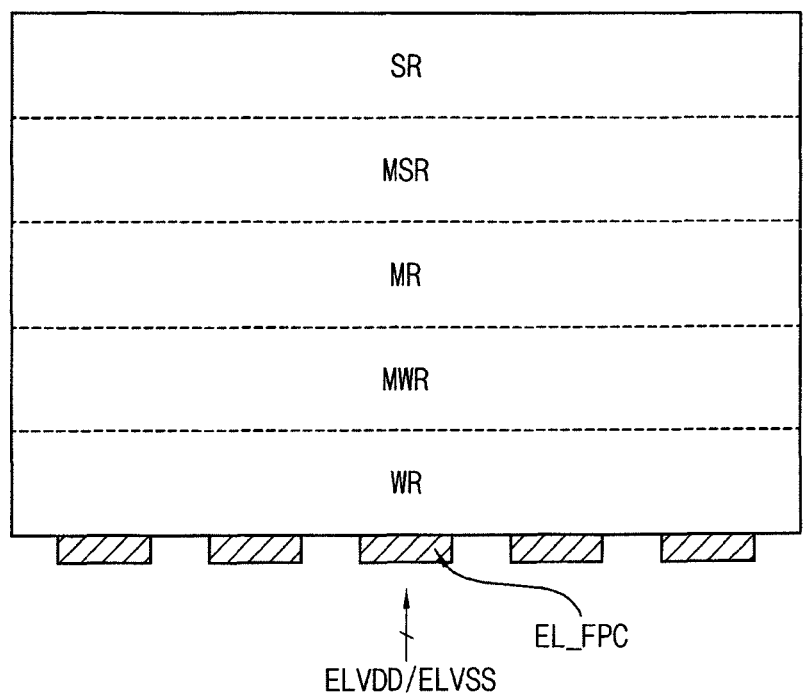
FIG. 2B is a diagram illustrating another example of a display panel manufactured by a method of FIG. 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

It will be understood that, although the terms first, second, third, etc. may be used herein to describe various elements, these elements should not be limited by these terms. These terms are merely used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
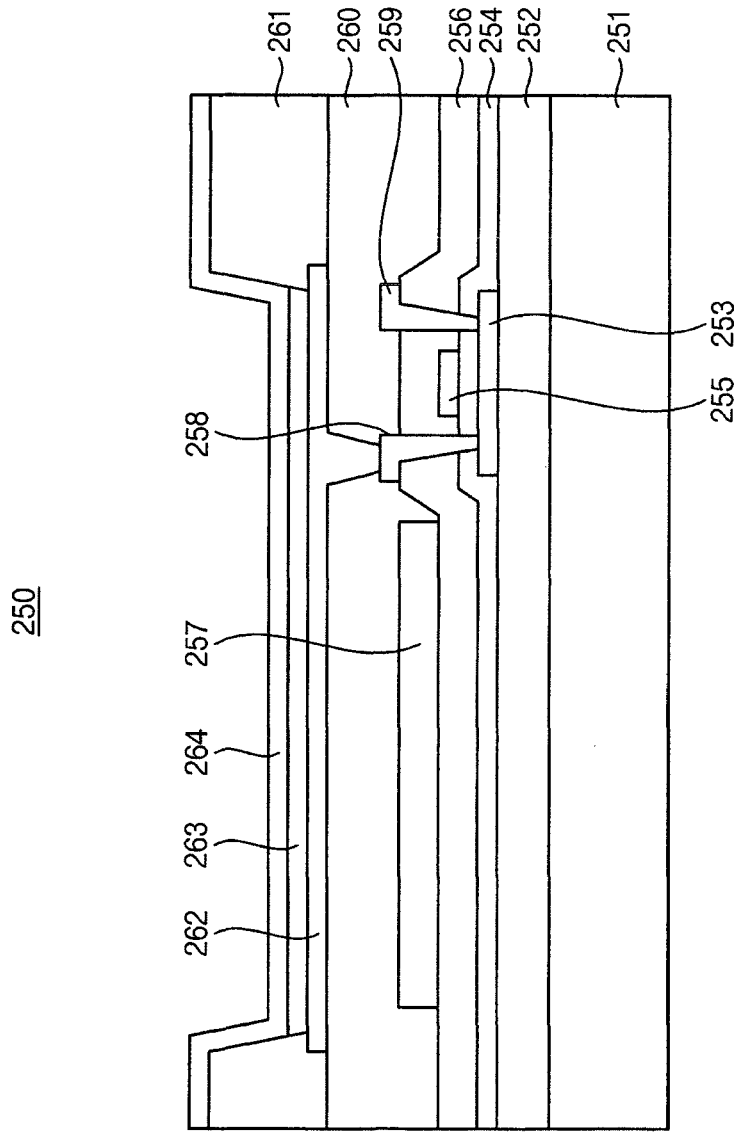
FIG. 3A is a cross-sectional diagram illustrating an example in which patterns are formed on an over-coating layer by a method of FIG. 1.
Figure 3B:
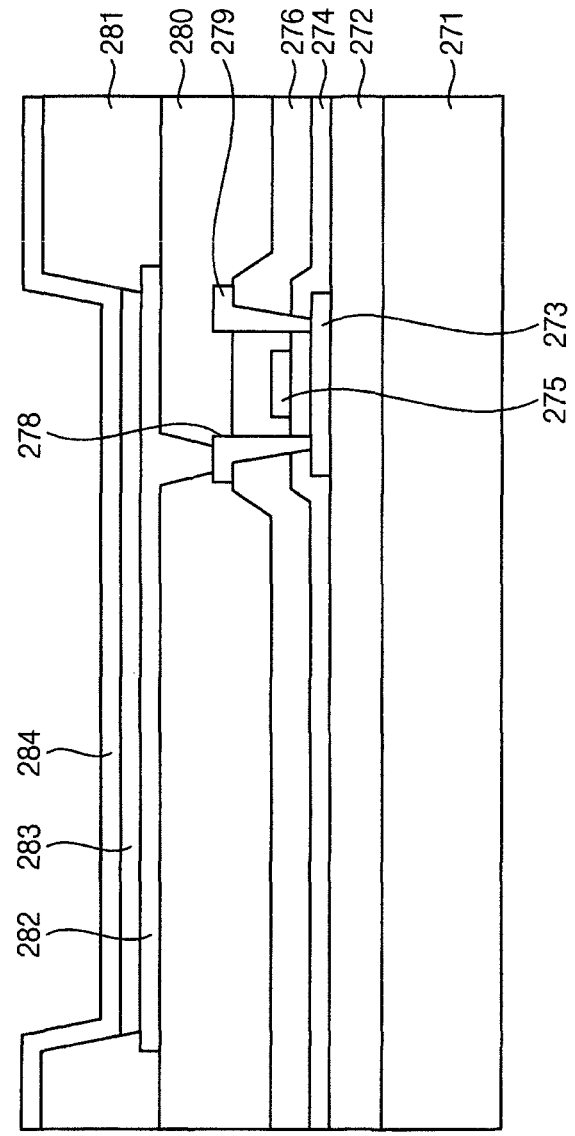
FIG. 3B is a cross-sectional diagram illustrating another example in which patterns are formed on an over-coating layer of one pixel by a method of FIG. 1.

FIG. 1 is a flow chart illustrating a method of manufacturing a display panel according to example embodiments. FIGS. 2A and 2B are diagrams illustrating examples of a display panel manufactured by a method of FIG. 1. FIGS. 3A and 3B are cross-sectional diagrams illustrating examples in which patterns are formed on an over-coating layer by a method of FIG. 1.

In the example embodiment shown in FIG. 1, the method of FIG. 1 may determine a plurality of pixel groups by grouping a plurality of pixels to be formed in the display panel 100 and 200 (operation S120), may calculate respective aperture ratios of the pixel groups based on respective distances between a power unit and the pixel groups (operation S140), and may form the pixels in the display panel 100 and 200 by applying the respective aperture ratios to the pixel groups (operation S160).

Generally, a high power voltage ELVDD is transferred from the power unit to the pixels via power lines. Here, a voltage drop (e.g., IR drop) of the high power voltage ELVDD may occur because the high power voltage ELVDD is transferred via the power lines. Thus, the high power voltage ELVDD having a relatively low voltage level may be applied to pixels that are far from the power unit, whereas the high power voltage ELVDD having a relatively high voltage level may be applied to pixels that are near to the power unit. A driving transistor may be included in each pixel operates as a constant-current source or a constant-voltage source in an organic light emitting display device. Thus, the voltage drop of the high power voltage ELVDD may result in a luminance decrease. That is, even when the same data signal is applied to each pixel, luminance of a display region (i.e., pixels) that is far from the power unit may be lower than the luminance of a display region (i.e., pixels) that is near to the power unit.

For example, when the high power voltage ELVDD is transferred from a lower display region of the display panel (e.g., the display panel 200) to an upper display region of the display panel, the voltage drop of the high power voltage ELVDD may largely occur in the upper display region of the display panel. As a result, luminance of the upper display region of the display panel may significantly decrease because a current flowing through the organic light emitting diode (i.e., referred to as an emission current) is reduced. On the other hand, when the high power voltage ELVDD is transferred from an upper display region of the display panel to a lower display region of the display panel, the voltage drop of the high power voltage ELVDD may largely occur in the lower display region of the display panel. As a result, luminance of the lower display region of the display panel may significantly decrease because the emission current is reduced. Furthermore, when the high power voltage ELVDD is transferred from an upper display region and a lower display region of the display panel (e.g., the display panel 100) to a middle display region of the display panel, the voltage drop of the high power voltage ELVDD may largely occur in the middle display region of the display panel. As a result, luminance of the middle display region of the display panel may significantly decrease because the emission current is reduced. Thus, luminance uniformity of the display panel may be degraded due to the voltage drop of the high power voltage ELVDD.

In addition, a voltage drop of the high power voltage ELVDD may become more serious as the display panel is made wider. Thus, the method of FIG. 1 may improve luminance uniformity of the display panel by applying different respective aperture ratios to the pixels (or, to the pixel groups) of the display panel based on the respective distances between the power unit and the pixels (or, the pixel groups).

Hereinafter, the method of FIG. 1 will be described in detail.

The method of FIG. 1 may determine the pixel groups by grouping the pixels to be formed in the display panel 100 and 200 (operation S120). As illustrated in FIG. 2A, the power voltages ELVDD and ELVSS may be transferred from the upper display region and the lower display region of the display panel 100 to the middle display region of the display panel 100 (i.e., both directions). As illustrated in FIG. 2B, the power voltages ELVDD and ELVSS may be transferred from the lower display region (or, the upper display region) of the display panel 200 to the upper display region (or, the lower display region) of the display panel 200 (i.e., one direction). In some example embodiments, the power lines by which the power voltages ELVDD and ELVSS are transferred may be parallel with a plurality of data lines in the display panel 100 and 200, and may be perpendicular to a plurality of scan lines in the display panel 100 and 200. Hence, the method of FIG. 1 may determine the pixel groups by at least one scan line when the pixels are grouped into the pixel groups.

In an example embodiment, the method of FIG. 1 may set pixels coupled to one scan line to constitute one pixel group. For example, when a full high definition (FHD) resolution (i.e., 1920×1080) is implemented for the display panel 100 and 200, 1080 pixel groups may exist in the display panel 100 and 200 because pixels coupled to one scan line constitute one pixel group. In this case, since the pixels are formed to have different respective aperture ratios by each scan line, the display panel 100 and 200 may have the aperture ratios that change linearly. In another example embodiment, the method of FIG. 1 may set pixels coupled to K scan lines, where K is an integer greater than or equal to 2 and less than or equal to the number of all scan lines, to constitute one pixel group. For example, when a FHD resolution (i.e., 1920×1080) is implemented for the display panel 100 and 200, 108 pixel groups may exist in the display panel 100 and 200 if pixels coupled to 10 scan lines constitute one pixel group. In this case, since the pixels are formed to have different respective aperture ratios by 10 scan lines, the display panel 100 and 200 may have the aperture ratios that change step-wise. For convenience of descriptions, it is illustrated in FIGS. 2A and 2B that the display panel 100 and 200 has aperture ratios having a step-wise change.

Next, the method of FIG. 1 may calculate the respective aperture ratios of the pixel groups based on the respective distances between the power unit and the pixel groups (operation S140). As described above, the voltage drop of the high power voltage ELVDD may increase as a distance between the power unit and one pixel group increases. In addition, as the voltage drop of the high power voltage ELVDD increases, the emission current decreases, so that luminance of the pixels (or, the pixel group) may decrease. Thus, the method of FIG. 1 may increase the respective aperture ratios of pixel groups that are far from the power unit, and may decrease the respective aperture ratios of the pixel groups that are near to the power unit.

After the respective aperture ratios of the pixel groups are calculated based on the respective distances between the power unit and the pixel groups, the method of FIG. 1 may form the pixels in the display panel 100 and 200 by applying the respective aperture ratios to the pixel groups (operation S160). For this operation, the method of FIG. 1 may increase a quantity of the patterns formed on respective over-coating layers of pixels (i.e., a pattern density of pixels) when a pixel group including the pixels is far from the power unit, and may decrease a quantity of the patterns formed on respective over-coating layers of pixels when a pixel group including the pixels is near to the power unit. Here, the method of FIG. 1 may use specific patterns that spread light, and such patterns may be formed as, e.g., stripe patterns, grid patterns, polygon patterns, circle patterns, etc. This will be described in detail below with reference to FIGS. 5 through 8.

Generally, a flattening resin layer referred to as the over-coating layer may be located under an anode layer to prevent a defect of an organic light emitting diode of a color filter type (e.g., WOLED-CF) due to a roughness of an underlying layer such as the color filter, etc., or to prevent a signal distortion due to potentials of other layers when signals are applied to underlying wires in an organic light emitting diode of a non-color filter type (e.g., RGB OLED). FIG. 3A shows an example of one pixel 250 related to the organic light emitting diode of the color filter type. FIG. 3B shows an example of one pixel 270 related to the organic light emitting diode of the non-color filter type.

In an implementation, the pixel 250 related to the organic light emitting diode of the color filter type may include a substrate 251, a buffer layer 252, a semiconductor layer 253 (i.e., an active layer), a gate dielectric layer 254, a gate electrode 255, an interlayer dielectric layer 256, a color filter layer 257, a drain electrode 258, a source electrode 259, an over-coating layer 260, a pixel definition layer 261 (i.e., a bank), a pixel electrode 262 (e.g., an anode layer), an electro luminescence layer 263, and a common electrode 264 (e.g., a cathode layer). In addition, the pixel 270 related to the organic light emitting diode of the non-color filter type may include a substrate 271, a buffer layer 272, a semiconductor layer 273 (i.e., an active layer), a gate dielectric layer 274, a gate electrode 275, an interlayer dielectric layer 276, a drain electrode 278, a source electrode 279, an over-coating layer 280, a pixel definition layer 281 (i.e., a bank), a pixel electrode 282 (e.g., an anode layer), an electro luminescence layer 283, and a common electrode 284 (e.g., a cathode layer).

As illustrated in FIGS. 3A and 3B, a contact hole may be formed in the over-coating layer 260 and 280 by a light exposure, where the contact hole is formed to couple the anode layer 262 and 282 to underlying wires. Thus, when the method of FIG. 1 adjusts the respective aperture ratios of the pixels, the method of FIG. 1 may perform the light exposure on respective aperture regions of the pixels using a mask having specific patterns, and may cure the respective aperture regions of the pixels to form a plurality of grooves.

Here, when the patterns (i.e., the grooves) are formed on the over-coating layer 260 and 280, the aperture ratio may increase because a surface area of a surface touching the electro luminescence layer 263 and 283 may be increased by the patterns (which may be, e.g., grooves). Thus, the method of FIG. 1 may improve luminance uniformity of the display panel 100 and 200 by increasing a quantity of the patterns formed on the respective over-coating layers 260 and 280 of pixels (i.e., by increasing a quantity of the patterns formed on the respective over-coating layers 260 and 280 of pixels) when a pixel group including the pixels is far from the power unit, and by decreasing a quantity of the patterns formed on the respective over-coating layers 260 and 280 of pixels (i.e., by decreasing a quantity of the patterns formed on the respective over-coating layers 260 and 280 of pixels) when a pixel group including the pixels is near to the power unit.

In an implementation, when the method of FIG. 1 sets pixels coupled to one scan line to constitute one pixel group, the display panel 100 and 200 may have the aperture ratios that change linearly by pixel group, i.e., with each group including pixels of a single scan line and the aperture ratios changing per scan line. In another implementation, when the method of FIG. 1 sets pixels coupled to K scan lines to constitute one pixel group, the display panel 100 and 200 may have the aperture ratios that change step-wise by group, i.e., with each pixel group including pixels of a predetermined number (a plurality) of scan lines and the aperture ratios changing per the predetermined number of scan lines.

In an example embodiment, as illustrated in FIG. 2A, the power voltages ELVDD and ELVSS are input to the display panel 100 via, e.g., a flexible printed circuit board EL_FPC, etc. Here, the power voltages ELVDD and ELVSS are transferred from the upper display region and the lower display region of the display panel 100 to the middle display region of the display panel 100. In this case, the voltage drop of the high power voltage ELVDD may significantly increase in the middle display region of the display panel 100, and thus the emission current may decrease in the pixels of the middle display region of the display panel 100 (i.e., luminance may decrease). Thus, the method of FIG. 1 may increase the respective aperture ratios of the pixel groups in the middle display region of the display panel 100. It is assumed in FIG. 2A that pixels coupled to K scan lines constitute one pixel group, and thus 3 pixel groups WR, MR, and SR exist. In detail, the display panel 100 may include a first pixel group WR having a relatively low aperture ratio, a second pixel group MR having a relatively middle aperture ratio, and a third pixel group SR having a relatively high aperture ratio.

In another example embodiment, as illustrated in FIG. 2B, the power voltages ELVDD and ELVSS are applied to the display panel 200 via, e.g., a flexible printed circuit board EL_FPC, etc. Here, the power voltages ELVDD and ELVSS may be transferred from the lower display region of the display panel 200 to the upper display region of the display panel 200. In this case, the voltage drop of the high power voltage ELVDD may significantly increase in the upper display region of the display panel 200, and thus the emission current may decrease in the pixels of the upper display region of the display panel 200 (i.e., luminance may decrease). Thus, the method of FIG. 1 may increase the respective aperture ratios of the pixel groups in the upper display region of the display panel 200. It is assumed in FIG. 2B that pixels coupled to K scan lines constitute one pixel group, and thus 5 pixel groups WR, MWR, MR, MSR, and SR exist. In detail, the display panel 200 may include a first pixel group WR having a relatively low aperture ratio, a second pixel group MWR having a relatively low-middle aperture ratio, a third pixel group MR having a relatively middle aperture ratio, a fourth pixel group MSR having a relatively high-middle aperture ratio, and a fifth pixel group SR having a relatively high aperture ratio.

As described above, the method of FIG. 1 may manufacture the display panel 100 and 200 having improved luminance uniformity by increasing the respective aperture ratios of the pixel groups (e.g., by increasing a quantity of the patterns formed on the respective over-coating layers 260 and 280 of the pixels) as the respective distances between the power unit and the pixel groups increase, and by decreasing the respective aperture ratios of the pixel groups (e.g., by decreasing a quantity of the patterns formed on the respective over-coating layers 260 and 280 of the pixels) as the respective distances between the power unit and the pixel groups decrease. As a result, the display panel 100 and 200 may achieve high luminance uniformity because a decrease of the emission current due to the voltage drop of the high power voltage ELVDD may be compensated by different respective aperture ratios of the pixels when the voltage drop of the high power voltage ELVDD occurs according to locations of the pixels on the display panel 100 and 200. Hence, an organic light emitting display device having the display panel 100 and 200 may display a high-quality image. The method of FIG. 1 may manufacture the display panel 100 and 200 by simple manufacturing processes and low manufacturing costs because the method of FIG. 1 merely controls respective aperture ratios of pixels by increasing a quantity of the patterns formed on the respective over-coating layers 260 and 280 of pixels that are far from the power unit, and by decreasing a quantity of the patterns formed on the respective over-coating layers 260 and 280 of pixels that are near to the power unit.

Figure 4:
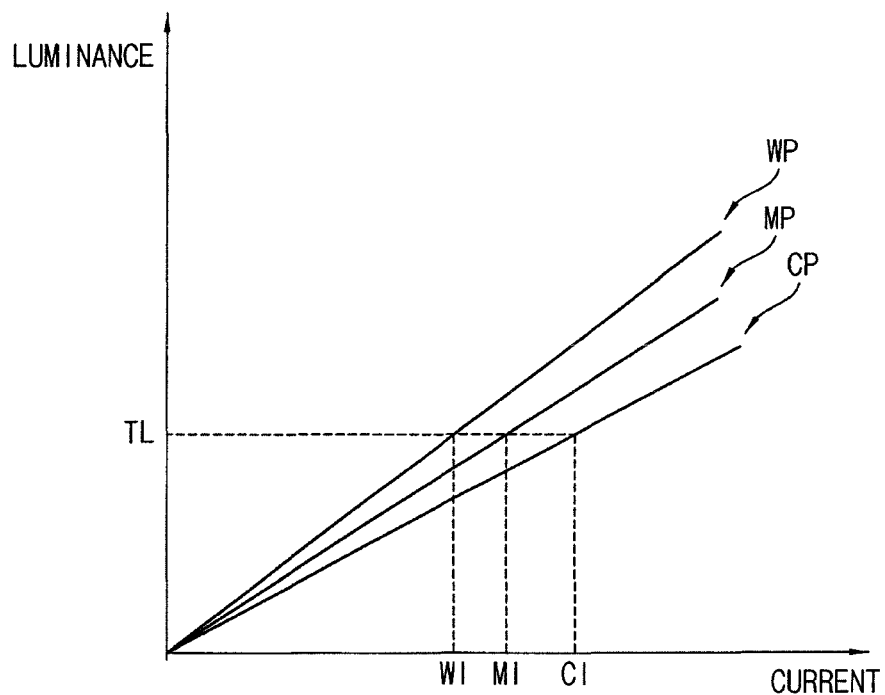
FIG. 4 is a graph illustrating how luminance uniformity of a display panel may be improved by a method of FIG. 1.

FIG. 4 is a graph illustrating how luminance uniformity of a display panel may be improved by the method of FIG. 1.

Referring to FIG. 4, a first line CP indicates emission current-luminance characteristics of pixels that are formed to have a relatively low aperture ratio, a second line MP indicates emission current-luminance characteristics of pixels that are formed to have a relatively middle aperture ratio, and a third line WP indicates emission current-luminance characteristics of pixels that are formed to have a relatively high aperture ratio.

As described above, the voltage drop of the high power voltage ELVDD applied to pixels may increase as respective distances between a power unit and a pixel group including the pixels increase. As a result, luminance of the organic light emitting diode may decrease because a current flowing through the organic light emitting diode (i.e., the emission current) decreases. Thus, the method of FIG. 1 may increase respective aperture ratios of pixel groups when the pixel groups are far from the power unit, and may decrease respective aperture ratios of pixel groups when the pixel groups are near to the power unit. That is, the first line CP corresponds to the emission current-luminance characteristics of pixels included in a pixel group having a relatively short distance from the power unit, the second line MP corresponds to the emission current-luminance characteristics of pixels included in a pixel group having a relatively middle distance from the power unit, and the third line WP corresponds to the emission current-luminance characteristics of pixels included in a pixel group having a relatively long distance from the power unit.

In further detail, a relatively large emission current CI may flow through respective organic light emitting diodes of the pixels included in the pixel group having a relatively short distance from the power unit because the voltage drop of the high power voltage ELVDD is relatively small. However, the pixels included in the pixel group having a relatively short distance from the power unit may achieve the target luminance TL because the pixels in the pixel group having a relatively short distance from the power unit have a relatively low aperture ratio. On the other hand, a relatively small emission current WI may flow through respective organic light emitting diodes of the pixels included in the pixel group having a relatively long distance from the power unit because the voltage drop of the high power voltage ELVDD is relatively great. However, the pixels included in the pixel group having a relatively long distance from the power unit may achieve the target luminance TL because the pixels included in the pixel group having a relatively long distance from the power unit have a relatively high aperture ratio. In addition, a relatively middle emission current MI may flow through respective organic light emitting diodes of the pixels included in the pixel group having a relatively middle distance from the power unit. Here, the pixels included in the pixel group having a relatively middle distance from the power unit may also achieve the target luminance TL. Thus, the method of FIG. 1 may efficiently compensate a decrease of the emission current due to the voltage drop of the high power voltage ELVDD by increasing respective aperture ratios of pixel groups as respective distances between the power unit and the pixel groups increase, and by decreasing respective aperture ratios of pixel groups as respective distances between the power unit and the pixel groups decrease. As a result, the method of FIG. 1 may manufacture a display panel 100 and 200 having improved luminance uniformity.

Figure 5:
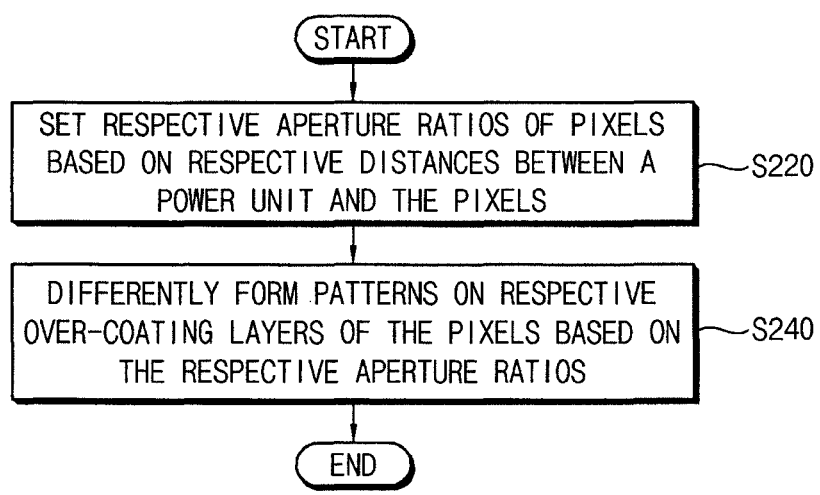
FIG. 5 is a flow chart illustrating an example in which patterns are formed on respective over-coating layers of pixels by a method of FIG. 1.

FIG. 5 is a flow chart illustrating an example in which patterns are formed on respective over-coating layers of pixels by a method of FIG. 1.

Referring to FIG. 5, the method of FIG. 1 may set respective aperture ratios of pixels based on respective distances between a power unit and the pixels (operation S220), and then may differently form patterns on respective over-coating layers of the pixels based on the respective aperture ratios of the pixels (operation S240). As a result, the respective aperture ratios of the pixels may differ because densities of the patterns formed on the respective over-coating layers of the pixels differ based on the respective distances between the power unit and the pixels. Here, it should be understood that patterns formed on respective over-coating layers of pixels indicate patterns formed on respective over-coating layers related to opening regions of pixels (i.e., related to emission regions of pixels).

As described above, the method of FIG. 1 may increase a quantity of patterns formed on respective over-coating layers of pixels as respective distances between the power unit and the pixels increase, and may decrease a quantity of patterns formed on respective over-coating layers of pixels as respective distances between the power unit and the pixels decrease. In an example embodiment, the method of FIG. 1 may differently form stripe patterns on respective over-coating layers of pixels based on respective distances between the power unit and the pixels. In another example embodiment, the method of FIG. 1 may differently form grid patterns on respective over-coating layers of pixels based on respective distances between the power unit and the pixels. In still another example embodiment, the method of FIG. 1 may differently form polygon patterns (e.g., hexagon patterns) on respective over-coating layers of pixels based on respective distances between the power unit and the pixels. However, a kind of patterns formed on respective over-coating layers of pixels is not limited thereto. For example, the method of FIG. 1 may differently form circle patterns on respective over-coating layers of pixels based on respective distances between the power unit and the pixels.

Figure 6:
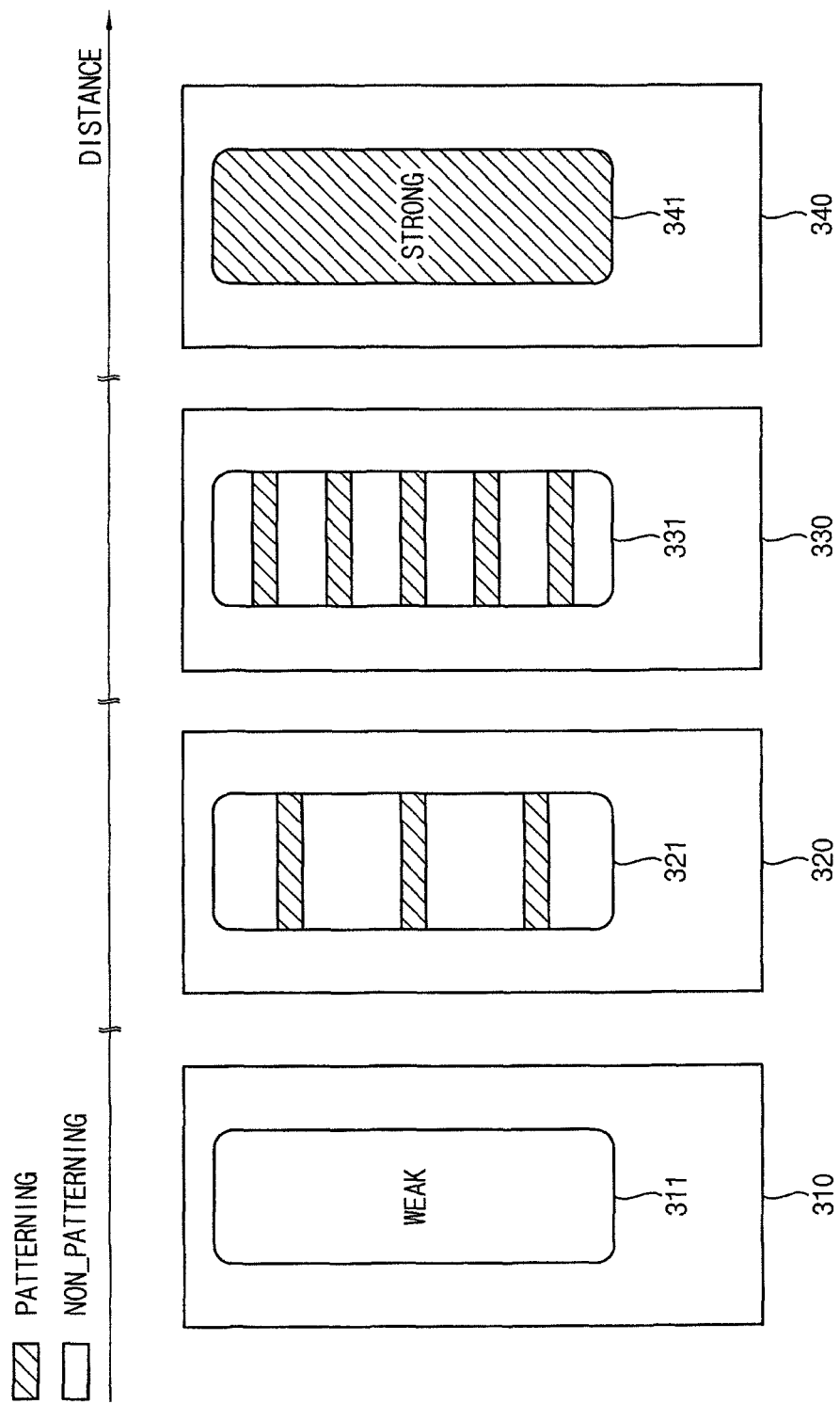
FIG. 6 is a diagram illustrating an example in which stripe patterns are formed on respective over-coating layers of pixels by a method of FIG. 1.

FIG. 6 is a diagram illustrating an example in which stripe patterns are formed on respective over-coating layers of pixels by a method of FIG. 1.

Referring to FIG. 6, the method of FIG. 1 may differently form stripe patterns on respective over-coating layers of opening regions 311, 321, 331, and 341 of pixels 310, 320, 330, and 340 included in a display panel based on respective distances between a power unit and the pixels 310, 320, 330, and 340. As illustrated in FIG. 6, the method of FIG. 1 uses stripe patterns to adjust respective aperture ratios of the opening regions 311, 321, 331, and 341 of the pixels 310, 320, 330, and 340. In detail, the method of FIG. 1 may increase respective aperture ratios of pixel groups that are far from the power unit, and may decrease respective aperture ratios of pixel groups that are near to the power unit. Thus, the method of FIG. 1 may increase a quantity of stripe patterns formed on respective over-coating layers of pixels included in a pixel group that is far from the power unit, and may decrease a quantity of stripe patterns formed on respective over-coating layers of pixels included in a pixel group that is near to the power unit. That is, in FIG. 6, the pixels 310, 320, 330, and 340 belong to different pixel groups, respectively. Here, at least one pixel that belongs to the same pixel group as the first pixel 310 may have the same quantity of stripe patterns formed on an over-coating layer as the first pixel 310, at least one pixel that belongs to the same pixel group as the second pixel 320 may have the same quantity of stripe patterns formed on an over-coating layer as the second pixel 320, at least one pixel that belongs to the same pixel group as the third pixel 330 may have the same quantity of stripe patterns formed on an over-coating layer as the third pixel 330, and at least one pixel that belongs to the same pixel group as the fourth pixel 340 may have the same quantity of stripe patterns formed on an over-coating layer as the fourth pixel 340.

The pixel groups may be determined by at least one scan line when the pixels 310, 320, 330, and 340 are grouped into the pixel groups. In an example embodiment, each pixel group may have one scan line. In another example embodiment, each pixel group may have a plurality of scan lines (e.g., 10 scan lines, 20 scan lines, 30 scan lines, 40 scan lines, etc). Thus, the method of FIG. 1 may improve luminance uniformity of the display panel by compensating a decrease of an emission current due to a voltage drop of the high power voltage ELVDD by different respective aperture ratios of the pixels 310, 320, 330, and 340 when the voltage drop of the high power voltage ELVDD occurs according to locations of the pixels 310, 320, 330, and 340 on the display panel. Here, it should be understood that stripe patterns formed on respective over-coating layers of the pixels 310, 320, 330, and 340 indicate stripe patterns formed on respective over-coating layers related to the opening regions 311, 321, 331, and 341 of the pixels 310, 320, 330, and 340 (i.e., related to emission regions 311, 321, 331, and 341 of the pixels 310, 320, 330, and 340).

Figure 7:
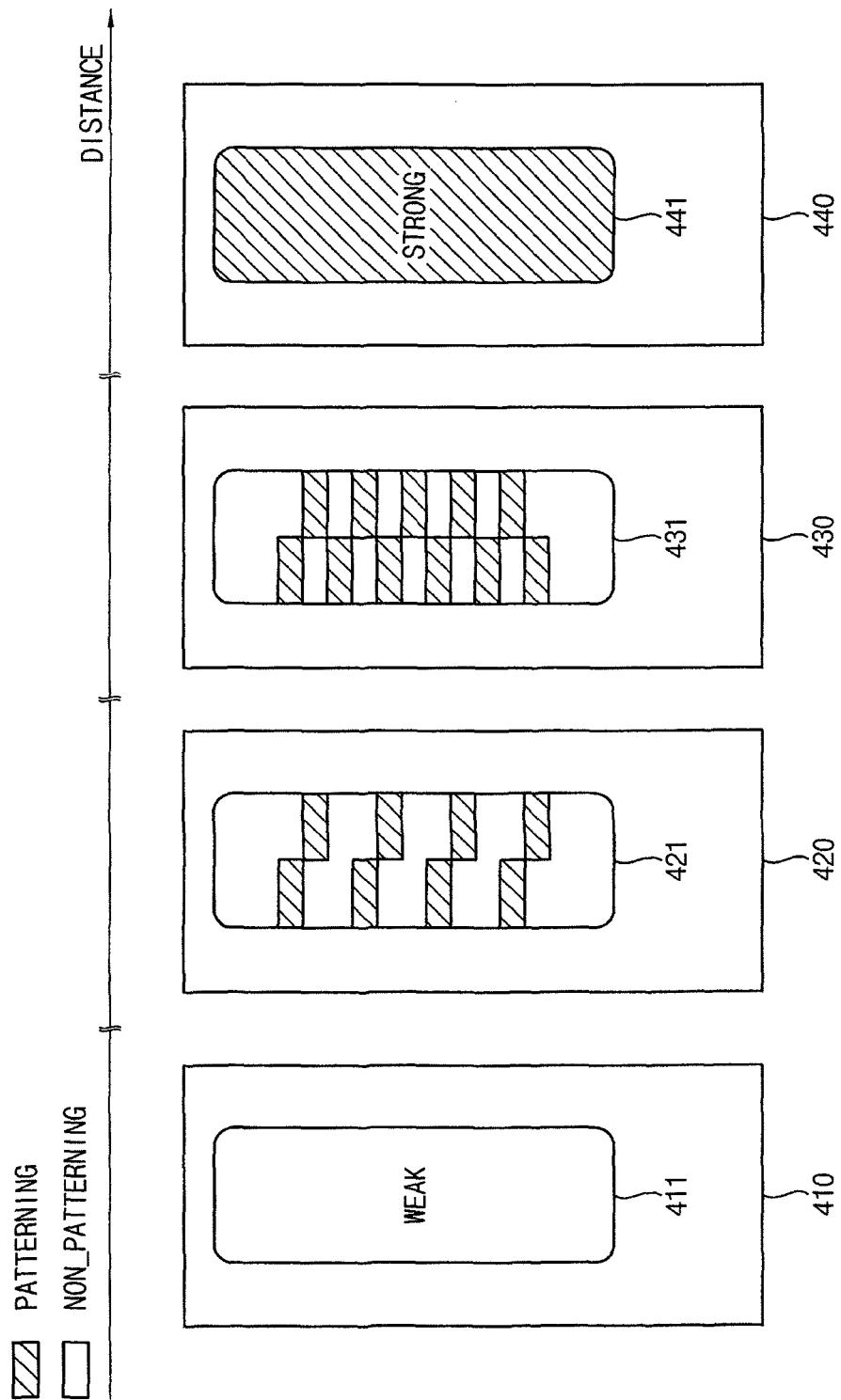
FIG. 7 is a diagram illustrating an example in which grid patterns are formed on respective over-coating layers of pixels by a method of FIG. 1.

FIG. 7 is a diagram illustrating an example in which grid patterns are formed on respective over-coating layers of pixels by a method of FIG. 1.

Referring to FIG. 7, the method of FIG. 1 may differently form grid patterns on respective over-coating layers of opening regions 411, 421, 431, and 441 of pixels 410, 420, 430, and 440 included in a display panel based on respective distances between a power unit and the pixels 410, 420, 430, and 440. As illustrated in FIG. 7, the method of FIG. 1 uses grid patterns to adjust respective aperture ratios of the opening regions 411, 421, 431, and 441 of the pixels 410, 420, 430, and 440. In detail, the method of FIG. 1 may increase respective aperture ratios of pixel groups that are far from the power unit, and may decrease respective aperture ratios of pixel groups that are near to the power unit. Thus, the method of FIG. 1 may increase a quantity of grid patterns formed on respective over-coating layers of pixels included in a pixel group that is far from the power unit, and may decrease a quantity of grid patterns formed on respective over-coating layers of pixels included in a pixel group that is near to the power unit. That is, in FIG. 7, the pixels 410, 420, 430, and 440 belong to different pixel groups, respectively. Here, at least one pixel that belongs to the same pixel group as the first pixel 410 may have the same quantity of grid patterns formed on an over-coating layer as the first pixel 410, at least one pixel that belongs to the same pixel group as the second pixel 420 may have the same quantity of grid patterns formed on an over-coating layer as the second pixel 420, at least one pixel that belongs to the same pixel group as the third pixel 430 may have the same quantity of grid patterns formed on an over-coating layer as the third pixel 430, and at least one pixel that belongs to the same pixel group as the fourth pixel 440 may have the same quantity of grid patterns formed on an over-coating layer as the fourth pixel 440.

The pixel groups may be determined by at least one scan line when the pixels 410, 420, 430, and 440 are grouped into the pixel groups. In an example embodiment, each pixel group may have one scan line. In another example embodiment, each pixel group may have a plurality of scan lines (e.g., 10 scan lines, 20 scan lines, 30 scan lines, 40 scan lines, etc). Thus, the method of FIG. 1 may improve luminance uniformity of the display panel by compensating a decrease of an emission current due to a voltage drop of the high power voltage ELVDD by different respective aperture ratios of the pixels 410, 420, 430, and 440 when the voltage drop of the high power voltage ELVDD occurs according to locations of the pixels 410, 420, 430, and 440 on the display panel. Here, it should be understood that grid patterns formed on respective over-coating layers of the pixels 410, 420, 430, and 440 indicate grid patterns formed on respective over-coating layers related to the opening regions 411, 421, 431, and 441 of the pixels 410, 420, 430, and 440 (i.e., related to emission regions 411, 421, 431, and 441 of the pixels 410, 420, 430, and 440).

Figure 8:
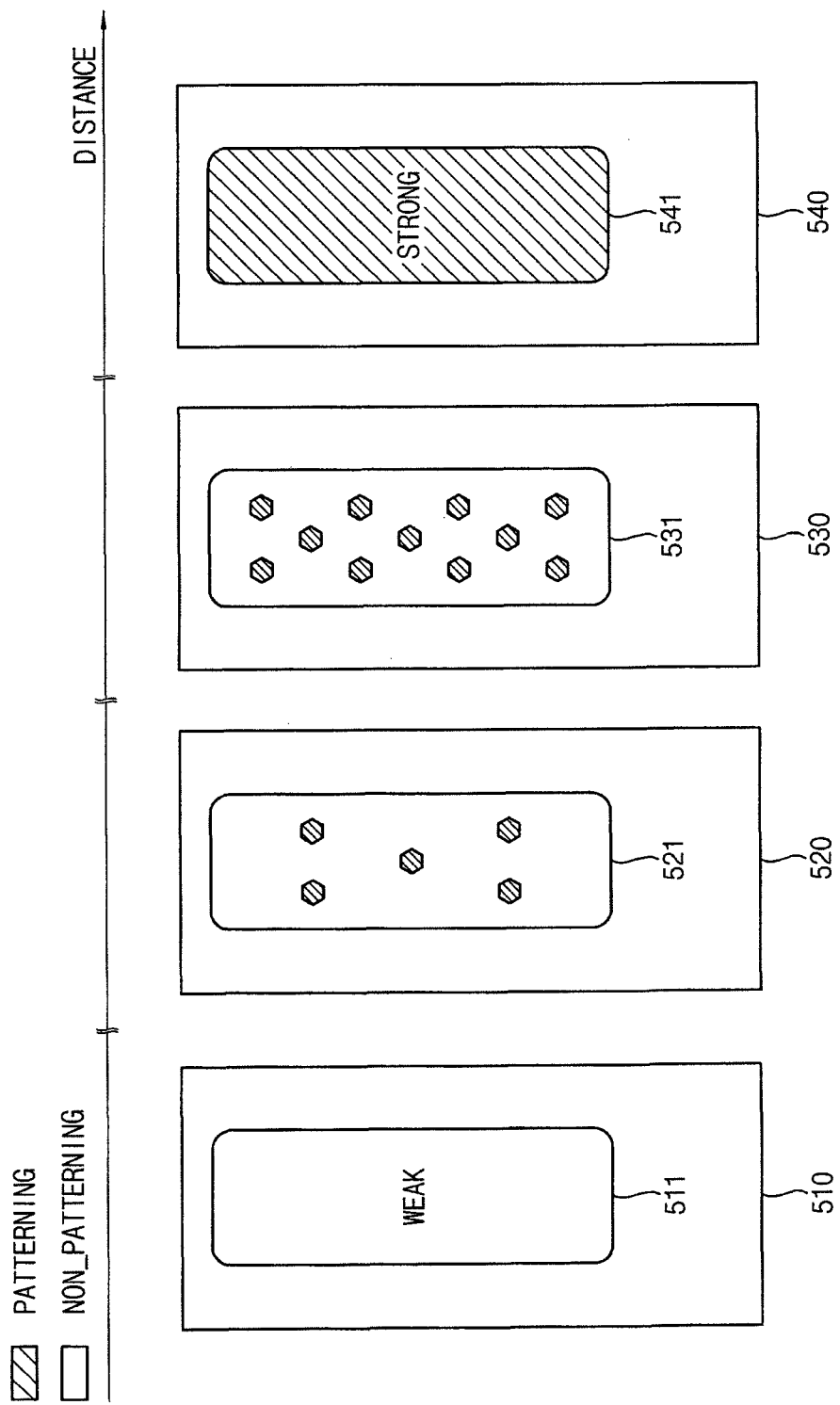
FIG. 8 is a diagram illustrating an example in which polygon patterns are formed on respective over-coating layers of pixels by a method of FIG. 1.

FIG. 8 is a diagram illustrating an example in which polygon patterns are formed on respective over-coating layers of pixels by a method of FIG. 1.

Referring to FIG. 8, the method of FIG. 1 may differently form polygon patterns (e.g., hexagon patterns) on respective over-coating layers of opening regions 511, 521, 531, and 541 of pixels 510, 520, 530, and 540 included in a display panel based on respective distances between a power unit and the pixels 510, 520, 530, and 540. As illustrated in FIG. 8, the method of FIG. 1 uses polygon patterns to adjust respective aperture ratios of the opening regions 511, 521, 531, and 541 of the pixels 510, 520, 530, and 540. In detail, the method of FIG. 1 may increase respective aperture ratios of pixel groups that are far from the power unit, and may decrease respective aperture ratios of pixel groups that are near to the power unit. Thus, the method of FIG. 1 may increase a quantity of polygon patterns formed on respective over-coating layers of pixels included in a pixel group that is far from the power unit, and may decrease a quantity of polygon patterns formed on respective over-coating layers of pixels included in a pixel group that is near to the power unit. That is, in FIG. 8, the pixels 510, 520, 530, and 540 belong to different pixel groups, respectively. Here, at least one pixel that belongs to the same pixel group as the first pixel 510 may have the same quantity of polygon patterns formed on an over-coating layer as the first pixel 510, at least one pixel that belongs to the same pixel group as the second pixel 520 may have the same quantity of polygon patterns formed on an over-coating layer as the second pixel 520, at least one pixel that belongs to the same pixel group as the third pixel 530 may have the same quantity of polygon patterns formed on an over-coating layer as the third pixel 530, and at least one pixel that belongs to the same pixel group as the fourth pixel 540 may have the same quantity of polygon patterns formed on an over-coating layer as the fourth pixel 540.

The pixel groups may be determined by at least one scan line when the pixels 510, 520, 530, and 540 are grouped into the pixel groups. In an example embodiment, each pixel group may have one scan line. In another example embodiment, each pixel group may have a plurality of scan lines (e.g., 10 scan lines, 20 scan lines, 30 scan lines, 40 scan lines, etc). Thus, the method of FIG. 1 may improve luminance uniformity of the display panel by compensating a decrease of an emission current due to a voltage drop of the high power voltage ELVDD by different respective aperture ratios of the pixels 510, 520, 530, and 540 when the voltage drop of the high power voltage ELVDD occurs according to locations of the pixels 510, 520, 530, and 540 on the display panel. Here, it should be understood that polygon patterns formed on respective over-coating layers of the pixels 510, 520, 530, and 540 indicate polygon patterns formed on respective over-coating layers related to the opening regions 511, 521, 531, and 541 of the pixels 510, 520, 530, and 540 (i.e., related to emission regions 511, 521, 531, and 541 of the pixels 510, 520, 530, and 540).

Figure 9:
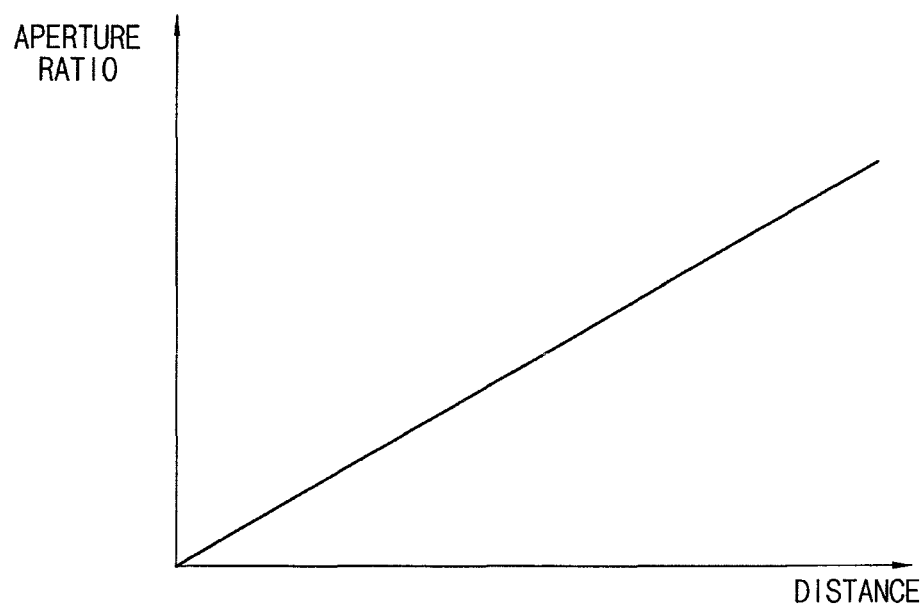
FIG. 9 is a graph illustrating aperture ratios having a linear-shape in a display panel manufactured by a method of FIG. 1.
Figure 10:
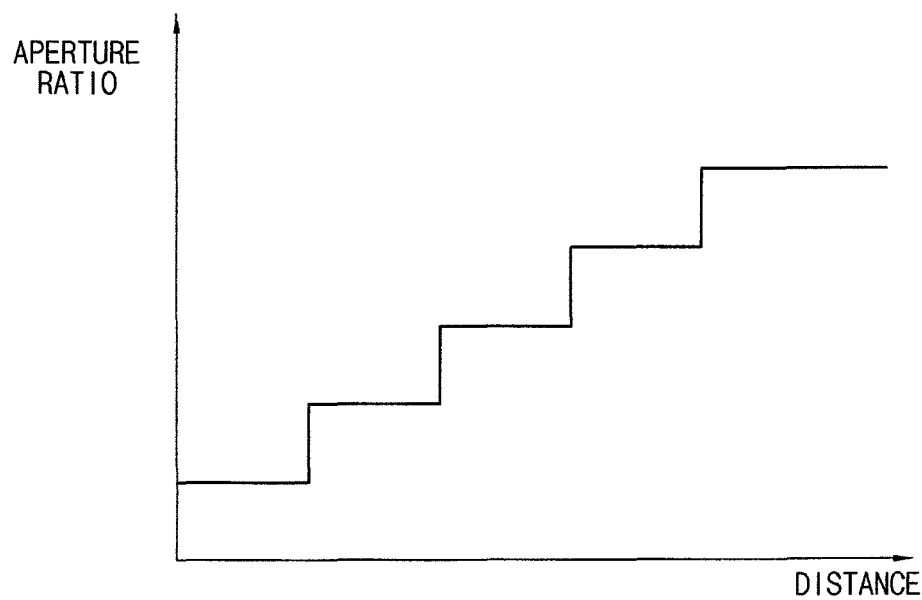
FIG. 10 is a graph illustrating aperture ratios having a step-wise in a display panel manufactured by a method of FIG. 1.

FIG. 9 is a graph illustrating aperture ratios having a linear increase in a display panel manufactured by a method of FIG. 1. FIG. 10 is a graph illustrating aperture ratios having a step-wise increase in a display panel manufactured by a method of FIG. 1.

Referring to FIGS. 9 and 10, it is illustrated that pixel groups of a display panel have different respective aperture ratios based on respective distances between a power unit and the pixel groups. As described above, the method of FIG. 1 may increase respective aperture ratios of pixel groups that are far from the power unit, and may decrease respective aperture ratios of pixel groups that are near to the power unit. Here, the method of FIG. 1 may determine the pixel groups by grouping a plurality of pixels to be formed in the display panel. In example embodiments, the method of FIG. 1 may determine the pixel groups by at least one scan line when the pixels are grouped into the pixel groups.

In an example embodiment, the method of FIG. 1 may set a plurality of pixels coupled to one scan line to constitute one pixel group. For example, when a FHD resolution (i.e., 1920× 1080) is implemented for the display panel, 1080 pixel groups may exist in the display panel because pixels coupled to one scan line constitute one pixel group. In this case, as illustrated in FIG. 9, the display panel may have aperture ratios having a linear increase in size because pixels are formed to have different respective aperture ratios by each scan line. In another example embodiment, the method of FIG. 1 may set a plurality of pixels coupled to K scan lines, where K is an integer greater than or equal to 2 and less than or equal to the number of all scan lines, to constitute one pixel group. For example, when a FHD resolution (i.e., 1920×1080) is implemented for the display panel, 108 pixel groups may exist in the display panel if pixels coupled to 10 scan lines constitute one pixel group. In this case, since pixels are formed to have different respective aperture ratios by 10 scan lines, the display panel may have aperture ratios having a step-wise increase in size. Meanwhile, as illustrated in FIG. 9, when pixels coupled to one scan line constitute one pixel group, a decrease of an emission current due to a voltage drop of the high power voltage ELVDD may be accurately compensated by the different respective aperture ratios. However, a process for forming patterns on respective over-coating layers of the pixels may be relatively complicated. On the other hand, as illustrated in FIG. 10, when pixels coupled to K scan lines constitute one pixel group, a process for forming patterns on respective over-coating layers of the pixels may be relatively simplified. However, a decrease of an emission current due to a voltage drop of the high power voltage ELVDD may not be as accurately compensated by the different respective aperture ratios. Thus, the pixel groups may be determined considering the above trade-off relation.

Figure 11:
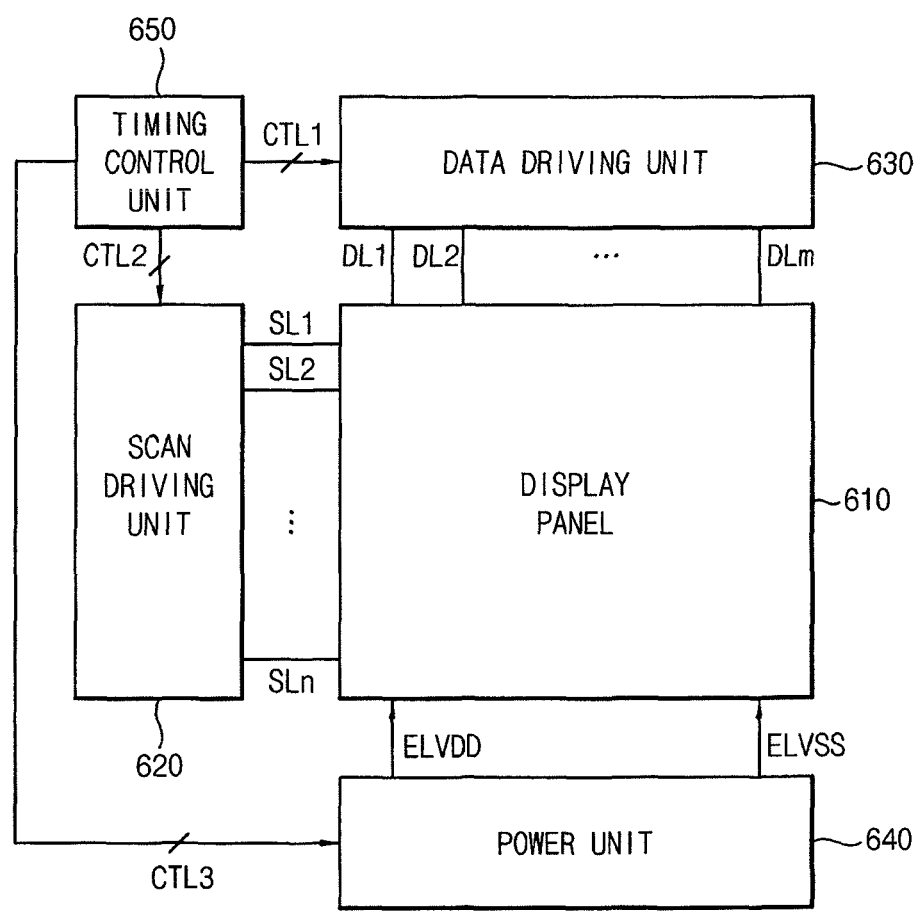
FIG. 11 is a block diagram illustrating an organic light emitting display device according to example embodiments.

FIG. 11 is a block diagram illustrating an organic light emitting display device according to example embodiments.

Referring to FIG. 11, the organic light emitting display device 600 may include a display panel 610, a scan driving unit 620, a data driving unit 630, a power unit 640, and a timing control unit 650.

The display panel 610 may include a plurality of pixels. In detail, the display panel 610 may further include a plurality of scan lines SL1 through SLn arranged in a first direction (e.g., X-axis direction in FIG. 11), the scan lines SL1 through SLn transferring a scan signal, a plurality of data lines DL1 through DLm arranged in a second direction (e.g., Y-axis direction in FIG. 11), the data lines DL1 through DLm transferring a data signal, and a plurality of power lines arranged in the first direction or the second direction, the power lines transferring a high power voltage ELVDD and a low power voltage ELVSS. Thus, the pixels may be arranged at locations corresponding to crossing points of the scan lines SL1 through SLn and the data lines DL1 through DLm.

Here, the pixels may be grouped into a plurality of pixel groups. In addition, the pixel groups may have different respective aperture ratios based on respective distances between the power unit 640 and the pixel groups. In an example embodiment, pixels coupled to one scan line SL1 through SLn may constitute one pixel group. In another example embodiment, pixels coupled to K scan lines SL1 through SLn, where K is an integer greater than or equal to 2 and less than or equal to the number of all scan lines SL1 through SLn, may constitute one pixel group. As described above, respective aperture ratios of the pixel groups that are far from the power unit 640 may be relatively high, and respective aperture ratios of the pixel groups that are near to the power unit 640 may be relatively low. To this end, a quantity of patterns formed on respective over-coating layers of pixels included in a pixel group that is far from the power unit 640 may be relatively high, and a quantity of patterns formed on respective over-coating layers of pixels included in a pixel group that is near to the power unit 640 may be relatively low.

The scan driving unit 620 may provide the scan signal to the pixels via the scan lines SL1 through SLn. The data driving unit 630 may provide the data signal to the pixels via the data lines DL1 through DLm. The power unit 640 may generate the high power voltage ELVDD and the low power voltage ELVSS to provide the high power voltage ELVDD and the low power voltage ELVSS to the pixels via the power lines. The timing control unit 650 may generate a plurality of control signals CTL1, CTL2, and CLT3 to provide the control signals CTL1, CTL2, and CLT3 to the scan driving unit 620, the data driving unit 630, and the power unit 640. Thus, the timing control unit 650 may control the scan driving unit 620, the data driving unit 630, and the power unit 640.

It is illustrated in FIG. 11 that the power unit 640 is located near a lower display region of the display panel 610. Thus, the pixels included in the lower display region of the display panel 610 may have a relatively low aperture ratio, and the pixels included in an upper display region of the display panel 610 may have a relatively high aperture ratio. On the other hand, the power unit 640 may be located near the upper display region of the display panel 610. Thus, the pixels included in the upper display region of the display panel 610 may have a relatively low aperture ratio, and the pixels included in the lower display region of the display panel 610 may have a relatively high aperture ratio. In some example embodiments, the high power voltage ELVDD and the low power voltage ELVSS may be transferred from the upper display region and the lower display region of the display panel 610 to a middle display region of the display panel 610. In this case, the pixels included in the middle display region of the display panel 610 may have a relatively high aperture ratio.

Figure 12:
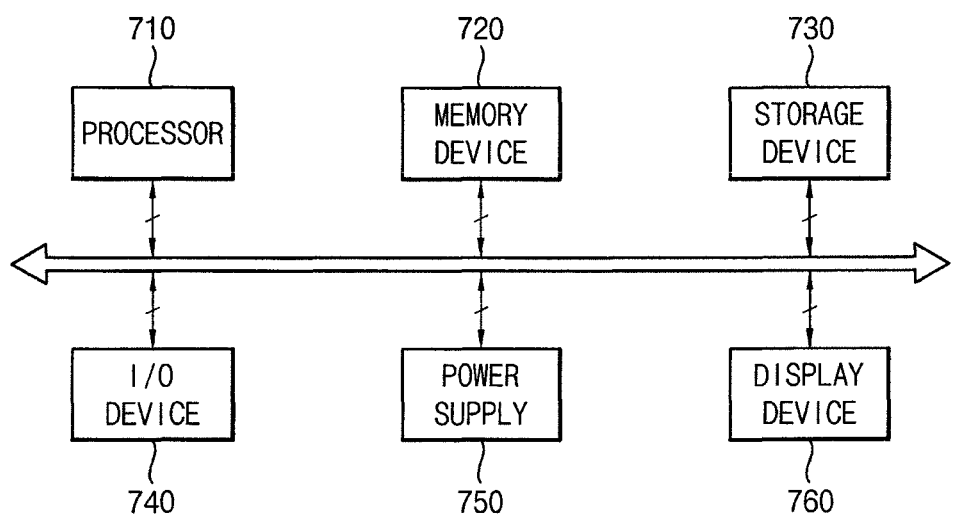
FIG. 12 is a block diagram illustrating an electronic device having an organic light emitting display device of FIG. 11.

FIG. 12 is a block diagram illustrating an electronic device having an organic light emitting display device of FIG. 11.

Referring to FIG. 12, the electronic device 700 may include a processor 710, a memory device 720, a storage device 730, an input/output (I/O) device 740, a power supply 750, and an organic light emitting display device 760. Here, the organic light emitting display device 760 may correspond to the organic light emitting display device 600 of FIG. 11. In addition, the electronic device 700 may further include a plurality of ports for communicating with a video card, a sound card, a memory card, a universal serial bus (USB) device, other electronic devices, etc.

The processor 710 may perform various computing functions. The processor 710 may be a micro processor, a central processing unit (CPU), etc. The processor 710 may be coupled to other components via an address bus, a control bus, a data bus, etc. Further, the processor 710 may be coupled to an extended bus such as a peripheral component interconnection (PCI) bus. The memory device 720 may store data for operations of the electronic device 700. For example, the memory device 720 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 730 may be a solid state drive (SSD) device, a hard disk drive (HDD) device, a CD-ROM device, etc.

The I/O device 740 may be an input device such as a keyboard, a keypad, a touchpad, a touch-screen, a mouse, etc, and an output device such as a printer, a speaker, etc. In some example embodiments, the organic light emitting display device 760 may be included in the I/O device 740. The power supply 750 may provide a power for operations of the electronic device 700. The organic light emitting display device 760 may communicate with other components via the buses or other communication links. As described above, the organic light emitting display device 760 may include a display panel, a scan driving unit, a data driving unit, a power unit, and a timing control unit, etc. Here, the display panel may include a plurality of pixels. The pixels are grouped into a plurality of pixel groups. The pixel groups may have different respective aperture ratios based on respective distances between the power unit and the pixel groups. As a result, the display panel may have improved luminance uniformity by compensating a decrease of an emission current due to a voltage drop of a high power voltage ELVDD by different respective aperture ratios. Therefore, the organic light emitting display device 760 may display a high-quality image.

Embodiments may be applied to a system having an organic light emitting display device. For example, embodiments may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

By way of summation and review, a pixel is generally coupled between a high power voltage ELVDD and a low power voltage ELVSS. Each pixel may emit light based on a current (an emission current) flowing through the organic light emitting diode, where the emission current is controlled by a driving transistor. Thus, when a ground voltage GND is used as the low power voltage ELVSS, luminance of each pixel (i.e., the organic light emitting diode) may increase as the high power voltage ELVDD increases. In other words, the higher the high power voltage ELVDD is, the greater luminance of each pixel is.

The current flowing through the organic light emitting diode is controlled by a data signal applied to each pixel for a given high power voltage ELVDD and low power voltage ELVSS. The high power voltage ELVDD should be substantially the same (i.e., uniform) for all pixels, but increases in size of the organic light emitting display device may result in the high power voltage ELVDD being changed according to a location of respective pixels on the display panel.

For example, the high power voltage ELVDD is transferred from a power unit (e.g., a power supplying device) to pixels via power lines, and a voltage drop (e.g., IR drop) may occur as the high power voltage ELVDD is transferred via the power lines. Thus, pixels that are far from the power unit may receive the high power voltage ELVDD having a relatively low voltage level, whereas pixels that are near to the power unit may receive the high power voltage ELVDD having a relatively high voltage level. As a result, even when the same data signal is applied to each pixel, luminance of a display region (i.e., pixels) that is far from the power unit may be lower than luminance of a display region (i.e., pixels) that is near to the power unit.

As described above, embodiments may provide a display panel configured to reduce or eliminate luminance non-uniformity from a voltage drop (e.g., IR drop) of a high power voltage, the voltage drop occurring when the high power voltage is transferred via power lines. Example embodiments may provide an organic light emitting display device having the display panel and a method of manufacturing the display panel.

A display panel according to embodiments may provide improved luminance uniformity by increasing respective aperture ratios of pixels that are far from a power unit, and by decreasing respective aperture ratios of pixels that are near to the power unit. An organic light emitting display device having the display panel according to example embodiments may display a high-quality image. A method of manufacturing a display panel according to example embodiments may form a display panel having improved luminance uniformity by increasing respective aperture ratios of pixels that are far from a power unit, and by decreasing respective aperture ratios of pixels that are near to the power unit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display panel of an organic light emitting display device, the display panel having a plurality of pixels, the method comprising:
   determining a plurality of pixel groups, the pixel groups corresponding to groups of pixels of the display panel;
   calculating aperture ratios for the pixels, respective aperture ratios being calculated by pixel group based on respective distances between a power unit and the pixel groups; and
   forming the pixels of the display panel to have the respective aperture ratios according to the corresponding pixel groups.

2. The method as claimed in claim 1, wherein pixels coupled to a single scan line of the display panel constitute one pixel group.

3. The method as claimed in claim 1, wherein pixels coupled to K scan lines of the display panel constitute one pixel group, K being an integer greater than or equal to 2 and less than or equal to a total number of all scan lines of the display panel.

4. The method as claimed in claim 1, wherein:
   the aperture ratios of the respective pixel groups increase as the respective distances between the power unit and the pixel groups increase, and
   the aperture ratios of the respective pixel groups decrease as the respective distances between the power unit and the pixel groups decrease.

5. The method as claimed in claim 4, wherein:
   a quantity of patterns formed on over-coating layers of the pixels increases as the respective distances between the power unit and the pixel groups increase, and
   the quantity of the patterns formed on the over-coating layers of the pixels decreases as the respective distances between the power unit and the pixel groups decrease.

6. The method as claimed in claim 5, wherein the patterns correspond to stripe patterns.

7. The method as claimed in claim 5, wherein the patterns correspond to grid patterns.

8. The method as claimed in claim 5, wherein the patterns correspond to polygon patterns.

9. A display panel, comprising:
a plurality of scan lines;
a plurality of data lines;
a plurality of power lines; and
a plurality of pixels, the pixels being disposed at locations corresponding to crossing points of the scan lines and the data lines, the pixels being grouped into pixel groups and having aperture ratios corresponding to the pixel groups, the pixel groups having different respective aperture ratios based on respective distances between a power unit and the pixel groups, the power unit being coupled to the power lines.

10. The display panel as claimed in claim 9, wherein pixels coupled to a single scan line of the display panel constitute one pixel group.

11. The display panel as claimed in claim 9, wherein pixels coupled to K scan lines of the display panel constitute one pixel group, K being an integer greater than or equal to 2 and less than or equal to a total number of all scan lines of the display panel.

12. The display panel as claimed in claim 9, wherein:
the aperture ratios of the respective pixel groups increase as the respective distances between the power unit and the pixel groups increase, and
the aperture ratios of the respective pixel groups decrease as the respective distances between the power unit and the pixel groups decrease.

13. The display panel as claimed in claim 12, wherein:
a quantity of patterns formed on over-coating layers of the pixels increases as the respective distances between the power unit and the pixel groups increase, and
the quantity of the patterns formed on the over-coating layers of the pixels decreases as the respective distances between the power unit and the pixel groups decrease.

14. An organic light emitting display device, comprising:
a display panel having a plurality of pixels, the pixels being grouped into pixel groups and having aperture ratios corresponding to the pixel groups;
a scan driving unit configured to provide a scan signal to the pixels;
a data driving unit configured to provide a data signal to the pixels;
a power unit configured to provide a high power voltage and a low power voltage to the pixels, the respective pixel groups having different aperture ratios based on respective distances between the power unit and the pixel groups; and
a timing control unit configured to control the scan driving unit, the data driving unit, and the power unit.

15. The device as claimed in claim 14, wherein pixels coupled a single scan line constitute one pixel group.

16. The device as claimed in claim 14, wherein pixels coupled to K scan lines constitute one pixel group, K being an integer greater than or equal to 2 and less than or equal to a total number of all scan lines.

17. The device as claimed in claim 14, wherein:
the aperture ratios of the respective pixel groups increase as the respective distances between the power unit and the pixel groups increase, and
the aperture ratios of the respective pixel groups decrease as the respective distances between the power unit and the pixel groups decrease.

18. The device as claimed in claim 17, wherein:
the high power voltage is transferred from an upper display region and a lower display region of the display panel to a middle display region of the display panel, and
the aperture ratios of the respective pixel groups are higher in the middle display region than in the upper display region and the lower display region.

19. The device as claimed in claim 17, wherein:
the aperture ratios of the respective pixel groups are higher in a lower display region of the display panel than in an upper display region of the display panel when the high power voltage is transferred from the upper display region to the lower display region, and
the aperture ratios of the respective pixel groups are higher in the upper display region than in the lower display region when the high power voltage is transferred from the lower display region to the upper display region.

20. The device as claimed in claim 17, wherein:
a quantity of patterns formed on over-coating layers of the pixels increases as the respective distances between the power unit and the pixel groups increase, and
the quantity of the patterns formed on the over-coating layers of the pixels decreases as the respective distances between the power unit and the pixel groups decrease.

21. The device as claimed in claim 17, wherein:
a surface area of a surface touching an electro luminescence layer of each pixel increases as the respective distances between the power unit and the pixel groups increase, and
the surface area of the surface touching the electro luminescence layer of each pixel decreases as the respective distances between the power unit and the pixel groups decrease.

* * * * *